United States Patent
Liu (10) Patent No.: US 10,481,441 B2
(45) Date of Patent: Nov. 19, 2019

(54) MASK, CORRESPONDING SPACER STRUCTURE, AND LIQUID CRYSTAL DISPLAY PANEL USING THE SAME

(71) Applicant: AU Optronics Corporation, Hsin-Chu (TW)

(72) Inventor: Yung-Chen Liu, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 103 days.

(21) Appl. No.: 15/787,957

(22) Filed: Oct. 19, 2017

(65) Prior Publication Data

US 2018/0307078 A1    Oct. 25, 2018

(30) Foreign Application Priority Data

Apr. 25, 2017 (TW) .............................. 106113808 A (51) Int. Cl.
| | | |
|---|---|---|
| *G02F 1/1339* | (2006.01) | |
| *G03F 1/00* | (2012.01) | |
| *G03F 1/50* | (2012.01) | |
| *G02F 1/1368* | (2006.01) | |

(52) U.S. Cl.
CPC ........ *G02F 1/13394* (2013.01); *G02F 1/1368* (2013.01); *G03F 1/50* (2013.01); *G02F 2001/13396* (2013.01)

(58) Field of Classification Search
CPC .......... G03F 1/00; G03F 1/50; G02F 1/13394; G02F 2001/13396
USPC .............................................. 430/5; 349/156
See application file for complete search history.

(56) References Cited

U.S. PATENT DOCUMENTS

| | | | |
|---|---|---|---|
| 5,204,765 A | 4/1993 | Mitsui et al. | |
| 6,097,458 A | 8/2000 | Tsuda et al. | |
| 7,034,808 B2 | 4/2006 | Sakata et al. | |
| 2006/0007530 A1 | 1/2006 | Otake et al. | |
| 2009/0057671 A1* | 3/2009 | Ryu .................. | G02F 1/133514 257/59 |
| 2009/0115954 A1* | 5/2009 | Tseng .................. | G02F 1/13394 349/156 |
| 2012/0008120 A1* | 1/2012 | Matsui .................. | G03F 7/0007 355/53 |

FOREIGN PATENT DOCUMENTS

| | | |
|---|---|---|
| TW | 426122 | 4/2001 |
| TW | 201317639 A | 5/2013 |
| TW | 201411252 A | 3/2014 |

OTHER PUBLICATIONS

Taiwan Intellectual Property Office, "Office Action", dated Jan. 7, 2019.
Taiwan Intellectual Property Office, "Office Action", dated Oct. 2, 2018.
Taiwan Patent Office "Office Action" dated Apr. 8, 2019, Taiwan.

* cited by examiner

*Primary Examiner* — John A McPherson
(74) *Attorney, Agent, or Firm* — WPAT, PC (57) ABSTRACT

A mask, a corresponding spacer structure and a liquid crystal display panel using the same are provided. The mask includes a first opening region and a second opening region. The first opening region and the second opening region respectively have geometric shapes with the ratio of the length to the width or the ratio of the long axis to the short axis being greater than or equal to 1.25, and the area of the first opening region is greater than the area of the second opening region.

8 Claims, 4 Drawing Sheets

MASK, CORRESPONDING SPACER STRUCTURE, AND LIQUID CRYSTAL DISPLAY PANEL USING THE SAME

BACKGROUND

Technical Field

The present disclosure relates to a mask, a corresponding spacer structure, and a panel using the same, and in particular, to a mask used for forming a spacer, a corresponding spacer structure, and a liquid crystal display panel using the same.

Related Art

In a conventional method for manufacturing a spacer, exposure energy is defined by using the aperture ratio of a gray tone mask or a halftone mask. The gray tone mask reduces effective exposure energy by means of the diffraction phenomenon generated by light when passing through an opening (or a slit), and openings (or slits) of different sizes and quantities correspond to different exposure energies, so as to manufacture spacers of different heights, briefly referred to as a multi size photo spacers (MPS). In addition, the halftone mask controls the intensity proportion of transmission light by means of the thickness of a chromium film coated on a pattern, so that a difference is generated between exposure energies of the transmission light, so as to manufacture spacers of different heights. However, the gray tone mask and the halftone mask have high manufacturing costs and difficulty in pattern designing, and the manufacturing costs can't be reduced.

SUMMARY

The present disclosure relates to a mask, a corresponding spacer structure, and a liquid crystal display panel using the same, where the mask is used to manufacture a spacer corresponding to the ratio of the length to the width or the ratio of the long axis to the short axis of a mask opening to achieve an objective of manufacturing spacers of different heights, and has good uniformity and reproducibility.

According to an aspect of the present disclosure, a mask is provided, including a first opening region and a second opening region. The first opening region and the second opening region respectively have geometric shapes with the ratio of the length to the width or the ratio of the long axis to the short axis being greater than or equal to 1.25, and the area of the first opening region is greater than the area of the second opening region.

According to an aspect of the present disclosure, a spacer structure formed by using the foregoing mask is provided, including a first spacer and a second spacer. The first spacer has a geometric shape corresponding to the ratio of the length to the width or the ratio of the long axis to the short axis of the first opening region, the second spacer has a geometric shape corresponding to the ratio of the length to the width or the ratio of the long axis to the short axis of the second opening region, and there is a height difference between the first spacer and the second spacer.

According to an aspect of the present disclosure, a liquid crystal display panel including the foregoing spacer structure is provided, including a thin film transistor array substrate, a liquid crystal layer, and a color filter substrate, where the first spacer and the second spacer are disposed on the color filter substrate and used for spacing the thin film transistor array substrate and the color filter substrate.

In order to make the aforementioned and other aspects of the present disclosure more comprehensible, embodiments accompanied with figures are described in detail below.

DETAILED DESCRIPTION

The following provides embodiments and describes them in detail. The embodiments below are merely used as examples for description instead of limiting the scope to be protected by the present disclosure. Same/similar components are represented by using same/similar symbols for description below.

Figure 1A:
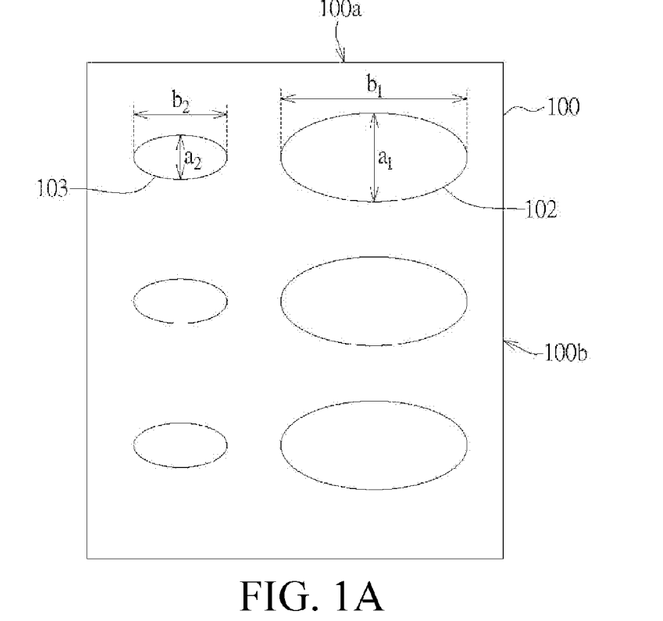
FIG. 1A is a schematic diagram of a mask used for forming a spacer according to an embodiment of the present disclosure.
Figure 1B:
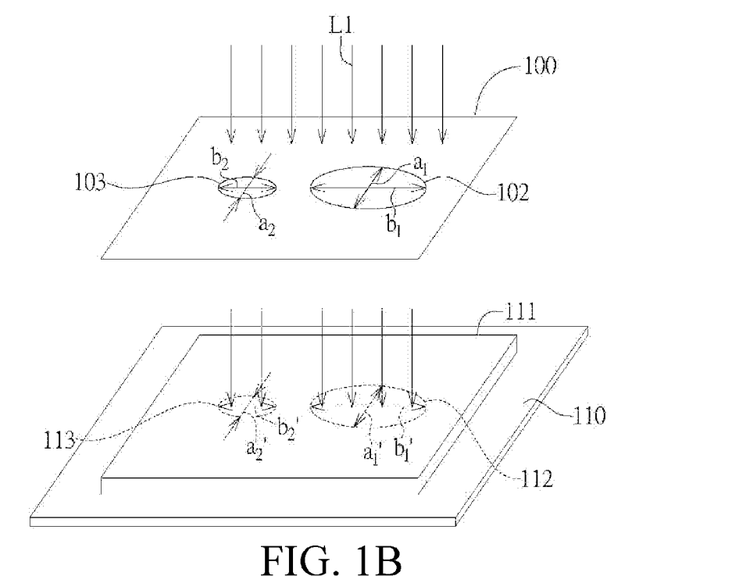
FIG. 1B is a schematic diagram of a spacer formed after a photosensitive material is exposed.

Referring to FIG. 1A and FIG. 1B, a mask 100 used for forming a spacer according to an embodiment of the present disclosure includes at least one first opening region 102 and at least one second opening region 103, and peripheries of the first opening region 102 and the second opening region 103 are covered by an opaque material to form a nontransparent region. In an embodiment, arrangement directions of the first opening region 102 and the second opening region 103 are not limited to be parallel to each other or perpendicular to each other. Alternatively, configuration directions of long sides or long axes of the first opening region 102 and the second opening region 103 may be adjusted according to requirements.

For example, in FIG. 1A, the long side or long axis of the first opening region 102 and the long side or long axis of the second opening region 103 are approximately parallel to a short side 100a of the rectangular mask 100. Alternatively, in another embodiment (not shown in the figure), the long side or long axis of the first opening region 102 and the long side or long axis of the second opening region 103 are approximately parallel to a long side 100b of the rectangular mask 100. For example, in FIG. 1A, the long side or long axis of the first opening region 102 and the long side or long axis of the second opening region 103 are parallel to each other. Alternatively, in another embodiment (not shown in the figure), the long side or long axis of the first opening region 102 and the short side or short axis of the second opening region 103 are parallel to each other. No limitation is imposed in this embodiment.

In an embodiment, the first opening region 102 and the second opening region 103 are preferably opening patterns having a same shape or a same feature, and the size (or area)

of the first opening region 102 is at least greater than the size (or area) of the second opening region 103. The size of the first opening region 102 is in micron scale, where in particular, the size (hereinafter referred to as a width $a_1$) of the short side or short axis of the first opening region 102 preferably ranges from 7 to 13 μm, and the size (hereinafter referred to as a length $b_1$) of the long side or long axis of the first opening region 102 ranges from 8.8 to 33 μm, so as to form a spacer corresponding to the size (the length $b_1$ and the width $a_1$) of the first opening region 102.

Figure 1C:
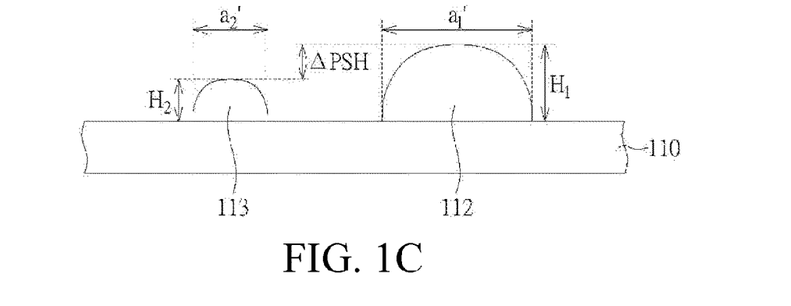
FIG. 1C is a side view of a spacer after development.

In FIG. 1B and FIG. 1C, experimental results show that when the width $a_1$ of the first opening region 102 ranges from 7 to 13 μm, a height $H_1$ of a first spacer 112 may be kept in a predetermined range (for example, from about 2.8 to 3.3 μm). The experimental results show that when the width $a_1$ of the first opening region 102 of the mask 100 is set to range from 7 to 13 μm, the size and height $H_1$ of the first spacer 112 after a photosensitive material 111 is developed have characteristics of uniformity and reproducibility.

Further, preferably, when a width $a_2$ of the second opening region 103 of the mask 100 is, for example, set to be about 7 μm, a size and a height $H_2$ of a second spacer 113 after the photosensitive material 111 is developed have characteristics of uniformity and reproducibility.

As shown in FIG. 1B and FIG. 1C, the first opening region 102 may allow a light ray L1 to be projected onto a photosensitive material 111 through the first opening region 102, so as to form a first spacer 112 on a substrate 110 after a development process. The second opening region 103 may allow the light ray L1 to be projected onto the photosensitive material 111 through the second opening region 103, so as to form a second spacer 113 on the substrate 110 after the development process. In an embodiment, the developed first spacer 112 has a geometric shape (for example, an ellipse or a rectangle) corresponding to the ratio ($b_1/a_1$) of the length to the width or the ratio ($b_1/a_1$) of the long axis to the short axis of the first opening region 102. Moreover, the developed second spacer 113 has a geometric shape (for example, an ellipse or a rectangle) corresponding to the ratio ($b_2/a_2$) of the length to the width or the ratio ($b_2/a_2$) of the long axis to the short axis of the second opening region 103. In addition, the first spacer 112 has a height $H_1$ and a width $a_1'$, and the second spacer 113 has a height $H_2$ and a width $a_2'$, where $H_1>H_2$ and $a_1'>a_2'$.

In an embodiment, the photosensitive material 111 may be a positive photoresist material or a negative photoresist material. After the negative photoresist material is exposed, a photoresist is cured or polymerized and cannot be dissolved by a developer, and an unexposed part is dissolved by the developer. In this embodiment, exposed parts of the negative photoresist material may be used as the first spacer 112 and the second spacer 113, or unexposed parts of the positive photoresist material may be used as the first spacer 112 and the second spacer 113.

In addition, in this embodiment, the intensity of an exposure light source (not shown in the figure) and the distance between the exposure light source and the mask 100 (exposure distance for short) or another parameter may be controlled to adjust an exposure dose needed by the photosensitive material 111. For example, exposure energy may be 40 mj or 50 mj, and the exposure distance may be 130 μm, 160 μm, or 190 μm.

In addition, the mask 100 used in this embodiment is a binary mask, which allows the exposure light source to pass through the first opening region 102 and the second opening region 103. As compared with a conventional gray tone mask, in which the transmittance of an opening is adjusted by using slits of different sizes or quantities, and as compared with a conventional halftone mask, in which the transmittance of an opening is adjusted by using the thickness of a chromium film, in the mask 100 of this embodiment, opening patterns (the first opening region 102 and the second opening region 103) are used to manufacture spacers of different heights. In addition, manufacturing costs of the binary mask are lower than costs of the conventional gray tone mask and halftone mask, and therefore this embodiment can effectively reduce production costs. In addition, there is a correlation between the width $a1'$ and the height $H_1$ of the manufactured first spacer 112 (there is also a correlation between the width $a2'$ and the height $H_2$ of the second spacer 113), and therefore the objective of adjusting the height of a spacer can be achieved by merely changing the width or the length (the short axis or the long axis) of the opening, without adjusting the transmittance of an opening by using a pattern of a gray tone mask or a halftone mask. Therefore, this embodiment has advantages of easier control and a simple process.

Referring to FIG. 1B and FIG. 1C, the exposure area (or size) of the first spacer 112 is greater than the exposure area (or size) of the second spacer 113, and therefore the height $H_1$ of the developed first spacer 112 is greater than the height $H_2$ of the developed second spacer 113, that is, $H_1>H_2$.

For example, referring to examples of Table 1, when the size (the width $a_1$) of the short side or short axis of the first opening region 102 is 7 μm, and the size (length $b_1$) of the long side or long axis of the first opening region 102 ranges from 8.8 to 24.5 μm, the width $a_1'$ of the first spacer 112 corresponding to the first opening region 102 may range from 6.28 to 8.24 μm and the length $b_1'$ may range from 5.66 to 14.73 μm, and the height $H_1$ of the first spacer 112 ranges from approximately 2.8 to 3.11 μm.

TABLE 1

| Width/Length of first opening region | | | | | | | | | |
|---|---|---|---|---|---|---|---|---|---|
| Width/ | $a_1$ | 7 | 7 | 7 | 7 | 7 | 7 | 7 | 7 |
| Length | $b_1$ | 8.8 | 10.5 | 12.3 | 17.5 | 19.3 | 21.0 | 22.8 | 24.5 |
| of first opening region | | | | | | | | | |
| Ratio | $b_1/a_1$ | 1.26 | 1.5 | 1.76 | 2.5 | 2.76 | 3 | 3.26 | 3.5 |
| Width/ | $a_1'$ | 6.28 | 7.08 | 7.98 | 8.21 | 8.24 | 8.14 | 8.09 | 7.97 |
| Length | $b_1'$ | 5.66 | 6.13 | 9.39 | 9.49 | 10.6 | 11.98 | 13.44 | 14.73 |
| of first spacer | | | | | | | | | |
| Height | $H_1$ | 2.8 | 2.95 | 3.07 | 3.11 | 3.11 | 3.10 | 3.09 | 3.08 |

Subsequently, referring to examples of Table 2, when the size (the width $a_1$) of the short side or short axis of the first opening region 102 is 9 μm, and the size (length $b_1$) of the long side or long axis direction of the first opening region 102 ranges from 13.5 to 29.3 μm, the width $a_1'$ of the first spacer 112 corresponding to the first opening region 102 may range from 8.2 to 8.68 μm and the length $b_1'$ may range from 8.47 to 20.6 μm, and the height $H_1$ of the first spacer 112 ranges from approximately 3.21 to 3.26 μm.

TABLE 2

| Width/ | $a_1$ | 9 | 9 | 9 | 9 | 9 | 9 | 9 | 9 |
|---|---|---|---|---|---|---|---|---|---|
| Length | $b_1$ | 13.5 | 15.8 | 18 | 20.3 | 22.5 | 24.8 | 27.0 | 29.3 |
| of first opening region | | | | | | | | | |
| Ratio | $b_1/a_1$ | 1.5 | 1.76 | 2 | 2.26 | 2.5 | 2.76 | 3 | 3.26 |
| Width/ | $a_1'$ | 8.2 | 8.53 | 8.64 | 8.68 | 8.68 | 8.61 | 8.42 | 8.44 |
| Length | $b_1'$ | 8.47 | 9.71 | 11.2 | 13.1 | 15 | 16.8 | 18.7 | 20.6 |
| of first | | | | | | | | | |

TABLE 2-continued

| spacer | | | | | | | | |
|---|---|---|---|---|---|---|---|---|
| Height $H_1$ | 3.22 | 3.25 | 3.26 | 3.25 | 3.23 | 3.22 | 3.21 | 3.21 |

Subsequently, referring to examples of Table 3, when the size (the width $a_1$) of the short side or short axis of the first opening region 102 is 11 μm, and the size (length $b_1$) of the long side or long axis of the first opening region 102 ranges from 13.8 to 33 μm, the width $a_1'$ of the first spacer 112 corresponding to the first opening region 102 may range from 8.93 to 9.6 μm and the length $b_1'$ may range from 9.43 to 24.88 μm, and the height $H_1$ of the first spacer 112 ranges from approximately 3.27 to 3.32 μm.

TABLE 3

| Width/ | $a_1$ | 11 | 11 | 11 | 11 | 11 | 11 | 11 | 11 |
|---|---|---|---|---|---|---|---|---|---|
| Length of first opening region | $b_1$ | 13.8 | 16.5 | 19.3 | 22 | 24.8 | 27.5 | 30.3 | 33 |
| Ratio | $b_1/a_1$ | 1.25 | 1.5 | 1.75 | 2 | 2.25 | 2.5 | 2.75 | 3 |
| Width/ | $a_1'$ | 8.93 | 9.28 | 9.49 | 9.58 | 9.6 | 9.48 | 9.35 | 9.57 |
| Length of first spacer | $b_1'$ | 9.43 | 11.03 | 13.25 | 15.61 | 18.07 | 20.53 | 22.81 | 24.88 |
| Height | $H_1$ | 3.3 | 3.32 | 3.32 | 3.3 | 3.28 | 3.27 | 3.27 | 3.27 |

Subsequently, referring to examples of Table 4, when the size (the width a1) of the short side or short axis of the first opening region 102 is 13 μm, and the size (length $b_1$) of the long side or long axis of the first opening region 102 ranges from 16.3 to 39.0 μm, the width $a_1'$ of the first spacer 112 may range from 10.53 to 11.2 μm and the length $b_1'$ may range from 11.13 to 26.58 μm, and the height $H_1$ of the first spacer 112 ranges from approximately 3.34 to 3.38 μm.

TABLE 4

| Width/ | $a_1$ | 13 | 13 | 13 | 13 | 13 | 13 | 13 | 13 |
|---|---|---|---|---|---|---|---|---|---|
| Length of first opening region | $b_1$ | 16.3 | 19.5 | 22.8 | 26.0 | 29.3 | 32.5 | 35.8 | 39.0 |
| Ratio | $b_1/a_1$ | 1.25 | 1.50 | 1.75 | 2.00 | 2.25 | 2.50 | 2.75 | 3.00 |
| Width/ | $a_1'$ | 10.53 | 10.88 | 11.09 | 11.20 | 11.08 | 10.95 | 11.17 | 11.21 |
| Length of first spacer | $b_1'$ | 11.13 | 12.73 | 14.95 | 17.31 | 19.77 | 22.23 | 24.51 | 26.58 |
| Height | $H_1$ | 3.36 | 3.38 | 3.38 | 3.35 | 3.35 | 3.35 | 3.34 | 3.34 |

It could be known from the content of the foregoing Table 1 to Table 4, when the width $a_1'$ of the first spacer 112 is increased from 7 μm to 13 μm, as the exposure area of the first spacer 112 increases, the height $H_1$ of the first spacer 112 may be increased from 2.8 μm to 3.38 μm. It is obvious that the exposure area (or size) of the spacer is positively correlated to the height after development.

Therefore, in this embodiment, heights of the first spacer 112 and the second spacer 113 after development may be slightly regulated by setting the sizes of the opening regions of the foregoing mask 100. For example, it is set that the first opening region 102 and the second opening region 103 of the mask 100 respectively have geometric shapes with the ratio ($b_1/a_1$) of the length to the width or the ratio ($b_1/a_1$) of the long axis to the short axis being greater than or equal to 1.25, and the area of the first opening region 102 is greater than the area of the second opening region 103. As shown in FIG. 1A, the first opening region 102 is an ellipse with the ratio ($b_1/a_1$) of the long axis to the short axis being greater than or equal to 1.25, and the second opening region 103 is an ellipse with the ratio ($b_2/a_2$) of the long axis to the short axis being greater than or equal to 1.25.

Referring to Table 5, in Experiment 1, exposure energy is set to 40 mj, and an exposure distance is set to 190 μm (represented by 40/190), in Experiment 2, exposure energy is set to 40 mj, and an exposure distance is set to 160 μm (represented by 40/160), in Experiment 3, exposure energy is set to 40 mj, and an exposure distance is set to 130 μm (represented by 40/130), in Experiment 4, exposure energy is set to 50 mj, and an exposure distance is set to 190 μm (represented by 50/190), in Experiment 5, exposure energy is set to 50 mj, and an exposure distance is set to 160 μm (represented by 50/160), and in Experiment 6, exposure energy is set to 50 mj, and an exposure distance is set to 130 μm (represented by 50/130). In addition, Example 1 indicates a height difference ΔPSH between the first spacer 112 and the second spacer 113 when $a_1=a_2=7$ μm, $b_1/a_1=1.5$, and $b_2/a_2>1.25$, Example 2 indicates a height difference ΔPSH between the first spacer 112 and the second spacer 113 when $a_1=a_2=7$ μm, $b_1/a_1>1.8$, and $b_2/a_2>1.25$, Example 3 indicates a height difference ΔPSH between the first spacer 112 and the second spacer 113 when $a_1=9$ μm, $a_2=7$ μm, $b_1/a_1>1.25$, and $b_2/a_2>1.25$, and Example 4 indicates a height difference ΔPSH between the first spacer 112 and the second spacer 113 when $a_1=11$ μm, $a_2=7$ μm, $b_1/a_1>1.25$, and $b_2/a_2>1.25$.

TABLE 5

| | | Spacer | | | | |
|---|---|---|---|---|---|---|
| | | | First spacer | | | |
| | | Second spacer | Example 1 | Example 2 | Example 3 | Example 4 |
| Size | | $a_2$ = 7.00 | $a_1$ = 7.00 | $a_1$ = 7.00 | $a_1$ = 9.00 | $a_1$ = 11.00 |
| | | $b_2$ = 8.80 | $b_1$ = 10.5 | $b_1$ | $b_1$ | $b_1$ |
| Ratio of length/width | | $b_2/a_2 > 1.25$ | $b_1/a_1 = 1.50$ | $b_1/a_1 > 1.8$ | $b_1/a_1 > 1.25$ | $b_1/a_1 > 1.25$ |
| Experiment 1 (40/190) | Height | $H_2$ = 2.88 | $H_1$ = 3.05 | $H_1$ = 3.17 | $H_1$ = 3.29 | $H_1$ = 3.35 |
| | ΔPSH $H_1 - H_2$ | | 0.15 to 0.2 | 0.3 to 0.35 | 0.4 to 0.45 | 0.45 to 0.5 |
| Experiment 2 (40/160) | Height | $H_2$ = 2.80 | $H_1$ = 2.95 | $H_1$ = 3.10 | $H_1$ = 3.21 | $H_1$ = 3.31 |
| | ΔPSH $H_1 - H_2$ | | 0.15 to 0.2 | 0.3 to 0.35 | 0.4 to 0.45 | 0.5 to 0.55 |
| Experiment 3 (40/130) | Height | $H_2$ = 2.50 | $H_1$ = 2.72 | $H_1$ = 2.99 | $H_1$ = 3.14 | $H_1$ = 3.22 |
| | ΔPSH $H_1 - H_2$ | | 0.2 to 0.25 | 0.45 to 0.5 | 0.6 to 0.65 | 0.7 to 0.75 |
| Experiment 4 (50/190) | Height | $H_2$ = 2.72 | $H_1$ = 2.88 | $H_1$ = 3.10 | $H_1$ = 3.20 | $H_1$ = 3.30 |
| | ΔPSH $H_1 - H_2$ | | 0.15 to 0.2 | 0.35 to 0.4 | 0.45 to 0.5 | 0.55 to 0.6 |

TABLE 5-continued

| | | Spacer | | | | |
| --- | --- | --- | --- | --- | --- | --- |
| | | | First spacer | | | |
| | | Second spacer | Example 1 | Example 2 | Example 3 | Example 4 |
| Experiment 5 (50/160) | Height ΔPSH | $H_2 = 3.04$ $H_1 - H_2$ | $H_1 = 3.13$ 0.1 to 0.15 | $H_1 = 3.19$ 0.15 to 0.2 | $H_1 = 3.29$ 0.2 to 0.25 | $H_1 = 3.35$ 0.25 to 0.3 |
| Experiment 6 (50/130) | Height ΔPSH | $H_2 = 3.11$ $H_1 - H_2$ | $H_1 = 3.21$ 0.1 to 0.15 | $H_1 = 3.26$ 0.15 to 0.2 | $H_1 = 3.32$ 0.2 to 0.25 | $H_1 = 3.39$ 0.25 to 0.3 |

In an embodiment, after the ratio ($b_1/a_1$) of the length to the width or the ratio ($b_1/a_1$) of the long axis to the short axis of the first opening region 102 and the ratio ($b_2/a_2$) of the length to the width or the ratio ($b_2/a_2$) of the long axis to the short axis of the second opening region 103 are set, the ratio ($a_1/a_2$) of the width or short axis of the first opening region 102 to the width or short axis of the second opening region 103 and/or the ratio ($b_1/b_2$) of the length or long axis of the first opening region 102 to the length or long axis of the second opening region 103 may be further set, so as to adjust the height difference ΔPSH between the first spacer 112 and the second spacer 113. In an embodiment, the width or short axis of the first opening region 102 may be greater than the width or short axis of the second opening region 103 (that is, $a_1 > a_2$), and the length or long axis of the first opening region 102 may be being greater than or equal to the length or long axis of the second opening region 103 (that is, $b_1 \geq b_2$). Alternatively, the width or short axis of the first opening region 102 may be equal to the width or short axis of the second opening region 103 (that is, $a_1 = a_2$), and the length or long axis of the first opening region 102 may be greater than the length or long axis (that is, $b_1 > b_2$) of the second opening region 103. For example, when the width $a_1$ of the first opening region 102 is, for example, 9 μm, and the width $a_2$ of the second opening region 103 is, for example, 7 μm, the ratio ($a_1/a_2$) of the width of the first opening region 102 to the width of the second opening region 103 is 9/7. Alternatively, when the width $a_1$ of the first opening region 102 is, for example, 11 μm, and the width $a_2$ of the second opening region 103 is, for example, 9 or 7 μm, the ratio ($a_1/a_2$) of the width of the first opening region 102 to the width of the second opening region 103 is 11/9 or 11/7. Alternatively, when the width $a_1$ of the first opening region 102 is, for example, 13 μm, and the width $a_2$ of the second opening region 103 is, for example, 11, 9, or 7 μm, the ratio ($a_1/a_2$) of the width of the first opening region 102 to the width of the second opening region 103 is 13/11, 13/9, or 13/7. Therefore, in this embodiment, the height difference ΔPSH between the first spacer 112 and the second spacer 113 after development is slightly adjusted by setting the ratio ($a_1/a_2$) of the width of the first opening region 102 to the width of the second opening region 103.

For example, referring to Example 3 of Table 5, when $a_1 = 9$ μm, $a_2 = 7$ μm, and the ratio of $a_1/a_2 = 9/7$, Experiment 1 and Experiment 2 in Example 3 show that the height difference ΔPSH between the first spacer 112 and the second spacer 113 after development may be controlled to range from 0.4 to 0.45 μm. Subsequently, referring to Example 4 of Table 5, when $a_1 = 11$ μm, $a_2 = 7$ μm, and the ratio of $a_1/a_2 = 11/7$, Experiment 1 and Experiment 2 in Example 4 show that the height difference ΔPSH between the first spacer 112 and the second spacer 113 after development may be controlled to be increased from a range of 0.4 to 0.5 μm to a range of 0.5 to 0.55 μm. Therefore, it could be derived from the foregoing Experiments 1 and 2 that when the width $a_1$ is increased from 9 μm to 11 μm, the height difference ΔPSH may be increased from a range of 0.4 to 0.45 μm to a range of 0.45 to 0.5 μm or from a range of 0.4 to 0.45 μm to a range of 0.5 to 0.55 μm. Likewise, it could be derived from Experiment 3 in Example 3 and Experiment 3 in Example 4 that when the width $a_1$ is increased from 9 μm to 11 μm, the height difference ΔPSH may be increased from a range of 0.6 to 0.65 μm to a range of 0.7 to 0.75 μm. It could be derived from Experiment 4 in Example 3 and Experiment 4 in Example 4 that when the width $a_1$ is increased from 9 μm to 11 μm, the height difference ΔPSH may be increased from a range of 0.45 to 0.5 μm to a range of 0.55 to 0.6 μm. It could be derived from Experiments 5 and 6 in Example 3 and Experiments 5 and 6 in Example 4 that when the width $a_1$ is increased from 9 μm to 11 μm, the height difference ΔPSH may be increased from a range of 0.2 to 0.25 μm to a range of 0.25 to 0.3 μm. It is obvious that the ratio of $a_1/a_2$ of the spacer is positively correlated to the height difference ΔPSH after development.

Further, referring to Example 1 of Table 5, when $a_1 = a_2 = 7$ μm, $b_1 = 10.5$ μm, $b_2 = 8.8$ μm, the ratio of $b_1/a_1 = 1.5$, and the ratio of $b_2/a_2 > 1.25$, Experiment 1 and Experiment 2 in Example 1 show that the height difference ΔPSH between the first spacer 112 and the second spacer 113 after development may be controlled to range from 0.15 to 0.2 μm. Subsequently, referring to Example 2 of Table 5, when $a_1 = a_2 = 7$ μm, $b_2 = 8.8$ μm, the ratio of $b_1/a_1 > 1.8$, and the ratio of $b_2/a_2 > 1.25$, Experiment 2 and Experiment 2 in Example 2 show that the height difference ΔPSH between the first spacer 112 and the second spacer 113 after development may be controlled to range from 0.3 to 0.35 μm. It could be derived from the foregoing Experiments 1 and 2 that when the length $b_1$ is increased, the height difference ΔPSH may be increased from a range of 0.15 to 0.2 to a range of 0.3 μm to 0.35 μm. Likewise, it could be derived from Experiment 3 in Example 1 and Experiment 3 in Example 2 that when the length $b_1$ is increased, the height difference ΔPSH may be increased from a range of 0.2 to 0.25 μm to a range of 0.45 to 0.5 μm. It could be derived from Experiment 4 in Example 1 and Experiment 4 in Example 2 that when the length $b_1$ is increased, the height difference ΔPSH may be increased from a range of 0.15 to 0.2 μm to a range of 0.35 to 0.4 μm. It could be derived from Experiments 5 and 6 in Example 1 and Experiments 5 and 6 in Example 2 that when the length $b_1$ is increased, the height difference ΔPSH may be increased from a range of 0.1 to 0.15 μm to a range of 0.15 to 0.2 μm. It is obvious that when $a_1 = a_2$, the ratio of $b_1/b_2$ of the spacer may also be positively correlated to the height difference ΔPSH after development.

Referring to a side view of spacers 112 and 113 after development shown in FIG. 1C, upper surfaces of the spacers 112 and 113 may slightly protrude, heights gradually decrease from a center to two sides, and side surfaces of the spacers are approximately perpendicular to an upper surface of the substrate 110. In an embodiment, the height difference ΔPSH between the first spacer 112 and the second spacer 113 may be controlled to range from a minimum 0.15 μm to a maximum 0.75 μm. No limitation is imposed in this embodiment.

Figure 1D:
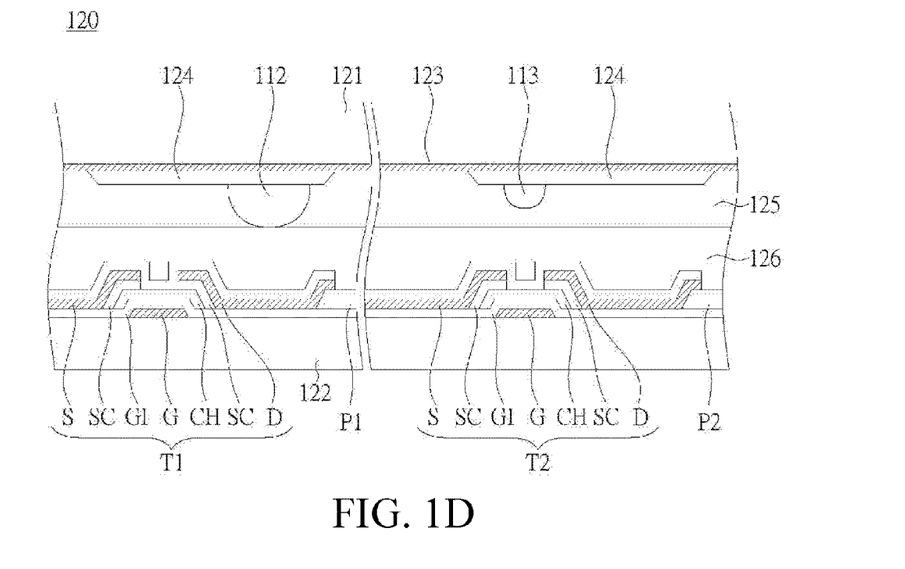
FIG. 1D is a brief schematic diagram of a liquid crystal display panel having a spacer structure according to an embodiment of the present disclosure.

Referring to FIG. 1D, FIG. 1 shows a liquid crystal display panel 120 according to an embodiment of the present disclosure. The liquid crystal display panel 120 may include a first substrate 121, a second substrate 122, and a liquid crystal layer 125. The first spacer 112 and the second spacer 113 in the foregoing embodiment may be formed on the first substrate 121 (for example, a color filter substrate) or the second substrate 122 (for example, a thin film transistor array substrate), and after the second substrate 122 and the first substrate 121 are relatively assembled, the first spacer 112 and the second spacer 113 are used for spacing the first substrate 121 and the second substrate 122. In an embodiment, a color filter layer (not shown in the figure), a common electrode 123, and a plurality of light shielding layers 124 (for example, black matrices) may be disposed on the first substrate 121. In addition, a plurality of thin film transistor components (only two of them are shown) T1 and T2, a plurality of pixel electrodes (only two of them are shown) P1 and P2, and a passivation layer 126 may be disposed on the second substrate 122, and each of the thin film transistor components T1 and T2 includes a gate G, a gate insulation layer GI, an active layer CH, two heavily doped semiconductor layers SC, a source S, and a drain D in sequence from the bottom to the top. The passivation layer 126 covers the thin film transistor components T1 and T2. In an embodiment, the first spacer 112 is, for example, in contact with the passivation layer 126 on the second substrate 122 or another structure, and is used for spacing the first substrate 121 and the second substrate 122, so as to maintain a gap between the first substrate 121 and the second substrate 122, and the second spacer 113 may produce an auxiliary supporting effect.

The first spacer 112 and the second spacer 113 may prevent the liquid crystal display panel 120 from being deformed due to a central recess, so as to keep spacing between the first substrate 121 and the second substrate 122 greater than a set value. In an embodiment, when a display surface of the liquid crystal display panel 120 is a curved surface, spacing between the first substrate 121 and the second substrate 122 may be adjusted by using the height difference ΔPSH between the first spacer 112 and the second spacer 113, and is not limited to fixed spacing. Certainly, in addition to two spacers of different heights in the figures, the liquid crystal display panel 120 may also adjust the spacing between the first substrate 121 and the second substrate 122 by using spacers of three or more heights. No limitation is imposed in this embodiment.

Figure 2A:
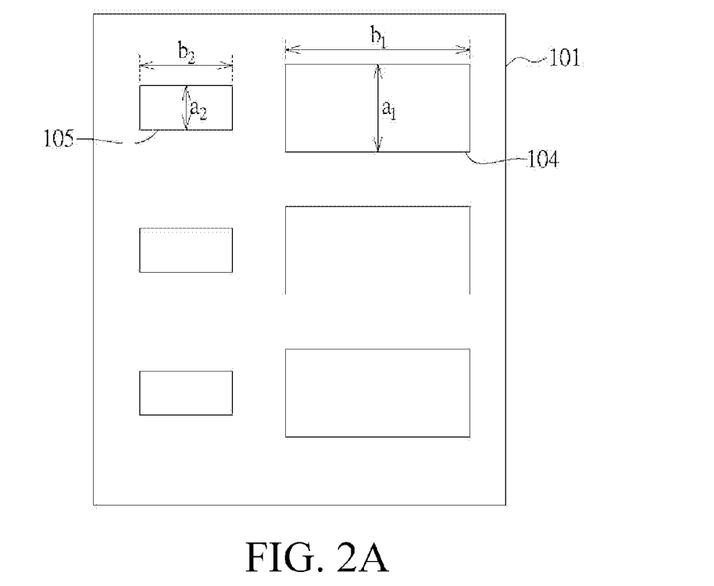
FIG. 2A is a schematic diagram of a mask used for forming a spacer according to an embodiment of the present disclosure.
Figure 2B:
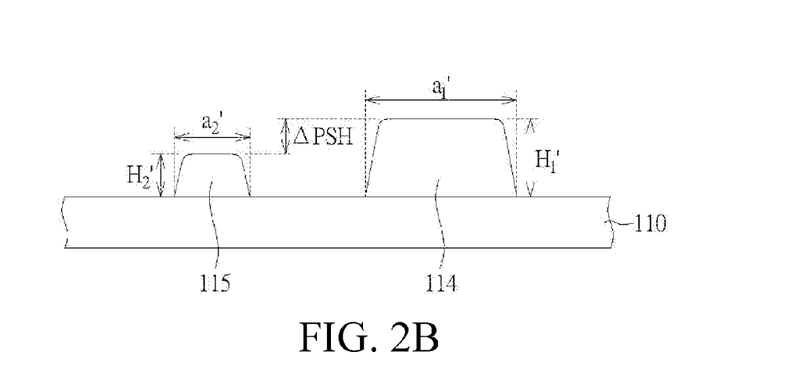
FIG. 2B is a side view of a spacer after development.

Referring to FIG. 2A and FIG. 2B, FIG. 2A shows a mask 101 of another embodiment, and FIG. 2B shows a spacer structure formed by using the mask 101. Different from the foregoing embodiment, in the mask 101 of this embodiment, the first opening region 104 is a rectangle with the ratio $(b_1/a_1)$ of the length to the width being greater than or equal to 1.25, the second opening region 105 is a rectangle with the ratio $(b_2/a_2)$ of the length to the width being greater than or equal to 1.25, and the area of the first opening region 104 is greater than the area of the second opening region 105. Meanwhile, the developed first spacer 114 has a shape corresponding to the ratio $(b_1/a_1)$ of the length to the width of the first opening region 104, and the developed second spacer 115 has a shape corresponding to the ratio $(b_2/a_2)$ of the length to the width of the second opening region 105. In FIG. 2B, an upper surface of the developed spacer may be a plane or slightly protrude, heights $H_1'$ and $H_2'$ may gradually decrease from a center to two sides or keep unchanged, and a side surface of the spacer is approximately perpendicular to or inclined to an upper surface of the substrate 110 (for example, a trapezoid). Relationships among the ratio $(b_1/a_1)$ of the length to the width of the first opening region 104, the ratio $(b_2/a_2)$ of the length to the width of the second opening region 105, and the height difference ΔPSH between the developed spacers are stated in the foregoing embodiment, and details are not described herein again.

Figure 3A:
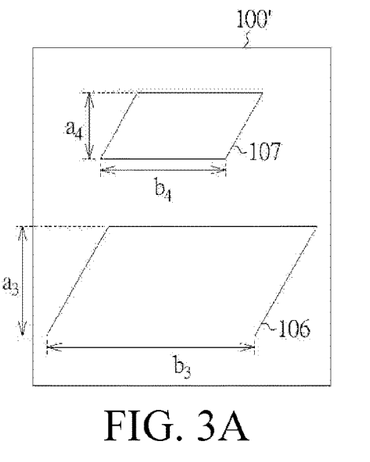
FIG. 3A and FIG. 3B are respectively schematic diagrams of opening regions of a mask according to another embodiment.
Figure 3B:
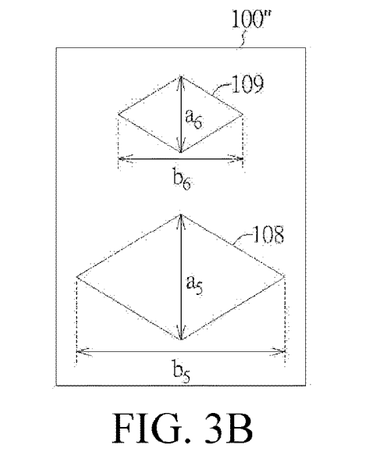

Subsequently, referring to FIG. 3A and FIG. 3B, FIG. 3A and FIG. 3B respectively show masks 100' and 100" of two other embodiments. An opening of the mask 100' is a parallelogram, and an opening of the mask 100" is a rhombus. In FIG. 3A, a first opening region 106 has a length $b_3$ and a width $a_3$, and a second opening region 107 has a length $b_4$ and a width $a_4$. Herein, the lengths $b_3$ and $b_4$ are set to be long side sizes of the parallelograms, and the widths $a_3$ and $a_4$ are set to be vertical distances between two opposite long sides of the parallelogram. The first opening region 106 is a parallelogram with the ratio $(b_3/a_3)$ of the length to the width being greater than or equal to 1.25, the second opening region 107 is a parallelogram with the ratio $(b_4/a_4)$ of the length to the width being greater than or equal to 1.25, and the area of the first opening region 106 is greater than the area of the second opening region 107. In addition, in FIG. 3B, a first opening region 108 has a long axis $b_5$ and a short axis $a_5$ in a diagonal direction, and the second opening region 109 has a long axis $b_6$ and a short axis $a_6$ in a diagonal direction. The first opening region 108 is a rhombus with the ratio $(b_5/a_5)$ of the length to the width being greater than or equal to 1.25, the second opening region 109 is a rhombus with the ratio $(b_6/a_6)$ of the length to the width being greater than or equal to 1.25, and the area of the first opening region 108 is greater than the area of the second opening region 109. It could be known from the foregoing description that a mask opening is not limited to an ellipse or a rectangle, may also be a parallelogram or a rhombus, or may be an elongated opening. A spacer formed by using a mask opening with a pattern, such as a parallelogram or a rhombus, has a characteristic similar to or the same as that of the spacer formed by using a mask opening in a shape of an ellipse or a rectangle in the foregoing embodiment, so that the height difference ΔPSH between a first spacer and a second spacer is adjusted.

Figure 4:
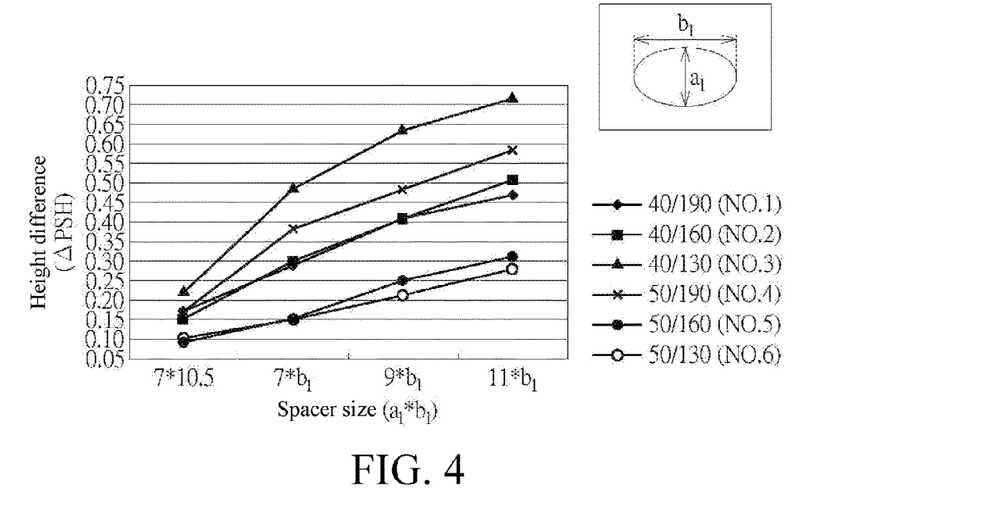
FIG. 4 is a chart of a relationship between the size of a spacer and the height difference.

Referring to FIG. 4 and Table 5, in FIG. 4, the vertical axis is the height difference ΔPSH, the horizontal axis is the size $(a_1*b_1)$ of the first spacer 112, where NO. 1 is a relationship line corresponding to a height difference ΔPSH and a size of a first spacer in Experiment 1 of Table 5; NO. 2 is a relationship line corresponding to a height difference ΔPSH and a size of a first spacer in Experiment 2 of Table 5; NO. 3 is a relationship line corresponding to a height difference ΔPSH and a size of a first spacer in Experiment 3 of Table 5; NO. 4 is a relationship line corresponding to a height difference ΔPSH and a size of a first spacer in Experiment 4 of Table 5; NO. 5 is a relationship line corresponding to a height difference ΔPSH and a size of a first spacer in Experiment 5 of Table 5; and NO. 6 is a relationship line corresponding to a height difference ΔPSH and a size of a first spacer in Experiment 6 of Table 5. All of the foregoing relationship lines NO. 1 to NO. 6 illustrate that when the area (or size) of the first spacer is increased, the height difference ΔPSH between the first spacer 112 and the second spacer 113 is also increased accordingly, and the area and the height difference ΔPSH are in a linear relationship. For example, in Experiment 1, the height difference ΔPSH may be increased from a range of 0.15 to 0.2 μm to a range of 0.45 to 0.5 μm; in Experiment 2, the height difference ΔPSH may be increased from a range of 0.15 to 0.2 μm to a range of 0.5 to 0.55 μm; in Experiment 3, the height difference ΔPSH may be increased from a range of 0.2 to 0.25 μm to a range of 0.7 to 0.75 μm; in Experiment 4, the height difference ΔPSH may be increased from a range of 0.15 to 0.2 μm to a range of 0.55 to 0.6 μm; in Experiment 5, the height difference ΔPSH may be increased from a range of 0.1 to 0.15 μm to a range of 0.25 to 0.3 μm; and in Experiment 6, the height difference ΔPSH may be increased from a range of 0.1 to 0.15 μm to a range of 0.25 to 0.3 μm. Therefore, a spacer formed by using the mask of this embodiment has good uniformity, and correspondingly, has good reproducibility and can be easily manufactured.

In the mask, the corresponding spacer structure, and the liquid crystal display panel using the same that are disclosed in the foregoing embodiments of the present disclosure, a binary mask is used to manufacture an opening pattern, so that an exposure light ray can directly pass through a first opening region and a second opening region. As compared with a conventional gray tone mask or a halftone mask, the binary mask used in the foregoing embodiments has manufacturing costs lower than those of the conventional gray tone mask and half tone mask, so that production costs can be reduced. In addition, the height of a spacer can be adjusted by merely changing the width or length (the size of the short axis or long axis) of an opening region. Therefore, the present disclosure has advantages of easy design and easy control. In addition, the spacers of the foregoing embodiments have good uniformity and reproducibility.

Based on the above, although the present disclosure has been disclosed above through the embodiments, the embodiments are not intended to limit the present disclosure. Persons of ordinary skill in the art may make various changes and modifications without departing from the spirit and scope of the present disclosure, and therefore the protection scope of the present disclosure should be subject to the appended claims.

What is claimed is:

1. A method of making a spacer structure by using a binary mask, comprising:
   providing the binary mask, wherein the binary mask has a first opening region and a second opening region, wherein the first opening region and the second opening region respectively have geometric shapes with the ratio of the length to the width or the ratio of the long axis to the short axis being greater than or equal to 1.25, and the area of the first opening region is greater than the area of the second opening region;
   projecting a light ray onto a photosensitive material through the first opening region and the second opening region of the binary mask to form a first spacer and a second spacer respectively;
   wherein the first spacer has a geometric shape corresponding to the ratio of the length to the width or the ratio of the long axis to the short axis of the first opening region, the second spacer has a geometric shape corresponding to the ratio of the length to the width or the ratio of the long axis to the short axis of the second opening region, and there is a height difference between the first spacer and the second spacer.

2. The method according to claim 1, wherein the area of the first spacer is greater than the area of the second spacer, the height of the first spacer is greater than the height of the second spacer, and the height difference between the first spacer and the second spacer is positively correlated to the area ratio between the first spacer and the second spacer.

3. The method according to claim 1, wherein the height difference between the first spacer and the second spacer ranges from 0.15 μm to 0.75 μm.

4. The method according to claim 1, wherein when the ratio of the length to the width or the ratio of the long axis to the short axis of the first opening region is greater than or equal to 1.5, and the ratio of the length to the width or the ratio of the long axis to the short axis of the second opening region is 1.25, the height difference between the first spacer and the second spacer ranges from 0.15 μm to 0.2 μm or from 0.2 μm to 0.25 μm.

5. The method according to claim 1, wherein when the ratio of the length to the width or the ratio of the long axis to the short axis of the first opening region is greater than 1.8, and the ratio of the length to the width or the ratio of the long axis to the short axis of the second opening region is 1.25, the height difference between the first spacer and the second spacer is controlled to range from 0.3 μm to 0.35 μm or from 0.45 μm to 0.5 μm.

6. The method according to claim 1, wherein when the width or short axis of the second opening region is 7 μm, and the width or short axis of the first opening region is increased from 9 μm to 11 μm, the height difference between the first spacer and the second spacer is increased from a range of 0.4 μm to 0.45 μm to a range of 0.45 μm to 0.5 μm or is increased from a range of 0.6 μm to 0.65 μm to a range of 0.7 μm to 0.75 μm.

7. The method according to claim 1, wherein when the width or short axis of the first opening region and the width or short axis the second opening region are equal to 7 μm, and the ratio of the length to the width or the ratio of the long axis to the short axis of the first opening region is increased from 1.5 to 1.8, the height difference between the first spacer and the second spacer is increased from a range of 0.15 μm to 0.2 μm to a range of 0.3 to 0.35 μm or is increased from a range of 0.2 μm to 0.25 μm to a range of 0.45 μm to 0.5 μm.

8. The method according to claim 1, wherein the first spacer and the second spacer are included in a liquid crystal display panel, wherein the liquid crystal display comprises a thin film transistor array substrate, a liquid crystal layer, and a color filter substrate, wherein the first spacer and the second spacer are disposed on the color filter substrate and used for spacing the thin film transistor array substrate and the color filter substrate.

* * * * *